United States Patent
Arora et al.

(10) Patent No.: US 7,167,017 B2
(45) Date of Patent: Jan. 23, 2007

(54) ISOLATION CELL USED AS AN INTERFACE FROM A CIRCUIT PORTION OPERABLE IN A POWER-DOWN MODE TO A CIRCUIT PORTION IN A POWER-UP MODE

(75) Inventors: Ravi Prakash Arora, Bangalore (IN); Anand Venkitachalam, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/908,307

(22) Filed: May 6, 2005

(65) Prior Publication Data

US 2006/0214687 A1 Sep. 28, 2006

(30) Foreign Application Priority Data

Mar. 24, 2005 (IN) .......................... 310/CHE/2005

(51) Int. Cl.
*H03K 17/16* (2006.01)
*H03K 19/0175* (2006.01)

(52) U.S. Cl. .............................. 326/21; 326/62; 326/82

(58) Field of Classification Search .................. 326/21, 326/62, 82, 83, 112, 121; 327/534
See application file for complete search history.

(56) References Cited

U.S. PATENT DOCUMENTS 6,970,032 B1 * 11/2005 Smith et al. ................. 327/407

* cited by examiner

*Primary Examiner*—Daniel D. Chang
(74) *Attorney, Agent, or Firm*—Ronald O. Neerings; W. James Brady, III; Frederick J. Telecky, Jr.

(57) ABSTRACT

An isolation cell provided between a first module (which can operate in either a power-up mode or a power down mode) and a second module. According to an aspect of the present invention, the isolation cell can be located to operate drawing power from either the first module or the second module without a floating node in the power-down mode of the first module. Due to the absence of the floating nodes, unneeded power drain is reduced/avoided. In one embodiment, a switch operates to connect power to a series of pair of inverters (propagating the signal from the first module to the second module) when the first module is in power-up mode and disconnects the power in the power-down mode.

8 Claims, 3 Drawing Sheets

ISOLATION CELL USED AS AN INTERFACE FROM A CIRCUIT PORTION OPERABLE IN A POWER-DOWN MODE TO A CIRCUIT PORTION IN A POWER-UP MODE

BACKGROUND OF THE INVENTION

1. Field of the Inventions

The present invention relates to the field of design of electronic circuits, and more specifically to a novel isolation cell used as an interface from a circuit portion operable in a power-down mode to a circuit portion in a power-up mode.

2. Related Art

There are often scenarios in which a portion of a circuit ("circuit portion") is operated in a power-down mode (i.e., no supply of power), while some other circuit portions (modules) are operated in power-up mode. For example, at least to conserve powers, some circuit portions are operated in power-down mode when the circuit is expected not to be used for a short duration, while some other circuit portions continue to operate, for example, to determine when to bring back the circuit portions in power-down mode back to power-up mode or to maintain state information for continuity of operation.

Such a feature has been found to be particularly useful in CMOS sub-micron integrated circuit technology since CMOS transistors, even if not clocked, are known to leak current. As an illustration, in 130 nm process and above, power consumtion was often reduced by using a clock gating logic (which stops transitions on the clock signal), reduction of operating voltage, etc. In 90 nm process and below (i.e, as fabrication technology advances to compact more elements into smaller area), inherent leakage present with CMOS components is also a substantial component of the total power consumed, (in addition to the active power) and thus is generally not ignored. The leakage power becomes more significant due to ultra large scale integration of millions of transistors. Thus, by powering down unneeded circuit portions, leakage current may be avoided, thereby increasing the efficiency of power usage.

One recognized problem with concurrent operation of some circuit portions in power-up mode and other circuit portions in power-down mode is that a circuit portion in power-down mode may provide an input to the circuit portions in power-up mode on corresponding input terminals. In such a configuration, an input terminal of a power-up module can be in an undetermined state (floating) and may cause the circuit to malfunction, and thus undesirable as is well known in the relevant arts.

An approach to avoiding such undesirable states is to provide an isolation cell, which maintains a corresponding input terminal of a circuit portion operating in power-up mode (receiving signal from a circuit portion operating in power-down mode) at a desired logic level to avoid malfunctioning of the integrated circuit. The isolation cell is further generally designed to propagate the input signal to a corresponding module when/after the operation of the module transitions from the power-down mode to power-up mode.

Isolation cells need to be implemented with various requirements. One requirement is to provide flexibility to a designer to locate the isolation cell along with circuit portions which operate always in power-up mode or along with circuit portions which can operate in power-down mode as well. Locating an isolation cell along with a portion implies that both the isolation cell and the portion are co-powered from the same source such that both would operate together in either power-up mode or power-down mode. The absence of the flexibility to locate the isolation cell in either portion can lead to disadvantages such as constraints in routing, which in turn leads to larger area requirements and difficulty in matching timing requirement etc.

Another general requirement is to reduce power consumption by an isolation cell, particularly if the isolation cell is located with a circuit portion in power-up mode since the energy from the power source can be unnecessarily drained otherwise. At least in consumer electronics types of areas, avoiding power drainage is desirable. As a further illustration, the corresponding devices generally need to have power conservation modes (power management) during which the current drawn is extremely low of the order of tens of microamperes.

Hence what is needed is an isolation cell which meets one or more requirements such as the ones noted above.

BRIEF DESCRIPTION OF THE DRAWINGS

The present invention will be described with reference to the accompanying drawings, which are described below briefly.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An isolation cell provided according to an aspect of the present invention can be located to operate using power from either a first module or a second module without a floating node (when one terminal of a transistor is powered, another terminal is left open) in the power-down mode of the first module. In such a situation, the isolation cell is provided between the first module and the second module, and may operate to connect an output of the first module to an input of second module when the second module is in power-up mode. The isolation cell may maintain the input of the second module at a desired logic value when the first module is in power-down mode.

In one embodiment, the isolation cell contains switch, a first inverter and a second inverter. The two inverters are connected in series and operate to propagate a value from the output of the first module to the input of the second module. The switch connects a power supply to both the inverters when the first module is in power-up mode and disconnects the power supply from both inverters when the first module is in power-down mode.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Integrated Circuit

Figure 1:
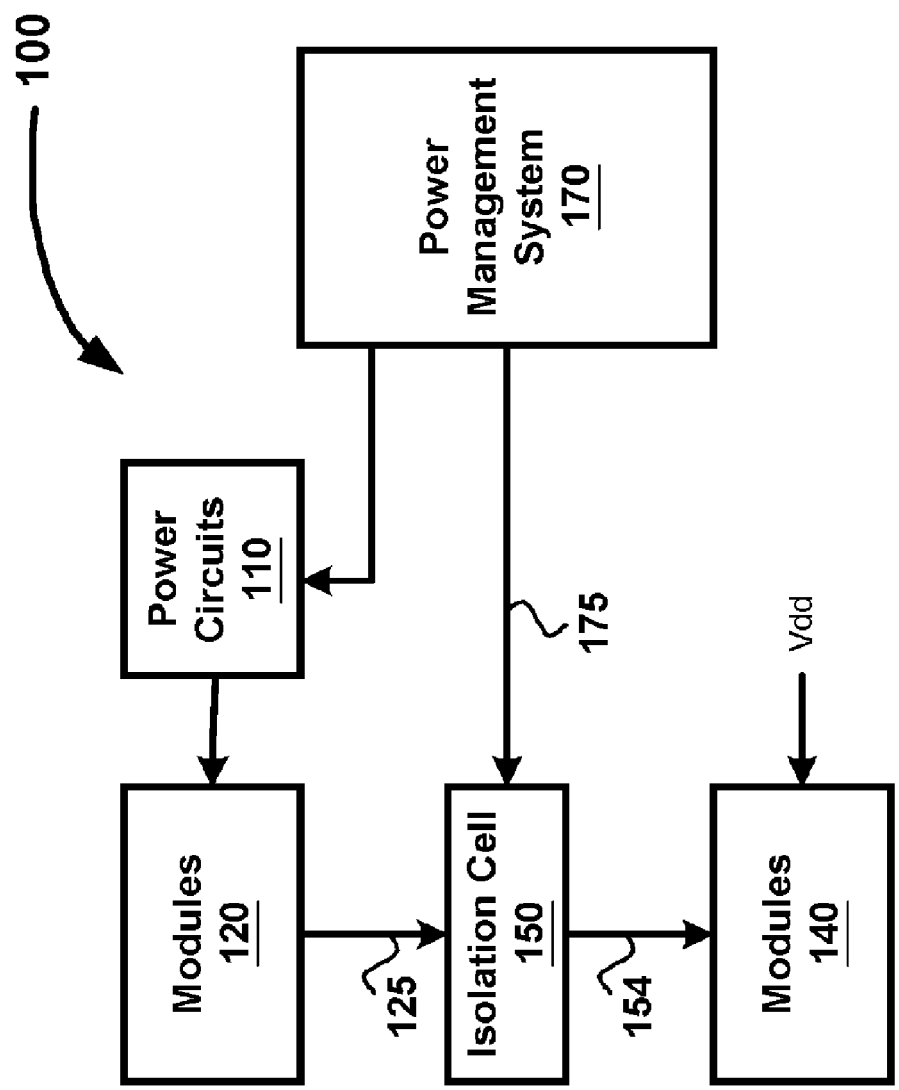
FIG. 1 is a block diagram of an example integrated circuit in which various aspects of the present invention can be implemented.

FIG. 1 is a block diagram of an example integrated circuit in which various aspects of the present invention can be implemented. The integrated circuit is shown containing modules 120 and 140, isolation cell 150, power circuit 110, and power management system 170. Each block is described below in further detail.

Module 120 is assumed to operate in power-up mode in some durations and in power-down mode in some other durations. Module 120 sends a digital signal (to module 140 via) isolation cell 150 on path 125 while in power-up mode, and sends no signal while in power-down mode causing an undesirable floating state at a terminal connected to path 125. Module 140 is assumed to operate always in power-up mode (shown directly connected to Vdd) and receives an input signal from isolation cell 150 on path 154. However, alternative embodiments can be implemented in which module 140 also operates either in power-up mode or power-down mode similar to module 120.

Power management unit 170 controls the power mode of module 120 according to the requirements of operation of integrated circuit 100. Power supply to module 120 is removed by sending an appropriate control signal to power circuit 110 (providing power to module 120), thereby causing module 120 to operate in power-down mode. Module 120 operates in power-up mode when power is supplied. Power management unit 170 sends a status signal on path 175 indicating the present power mode (power-up or power-down) of module 120 to isolation cell 150.

Isolation cell 150 maintains a desired logic level (e.g., logic low) on path 154, when status signal on path 175 indicates module 120 is in power-down mode. Isolation cell 150 provides a logic value on path 154 equal to logic value received on path 125 when the status signal indicates that module 120 is in power-up mode.

An aspect of the present invention enables isolation cell 150 to be located with module 120 (which can operate in power-down mode) or module 140 (always operating in power-up mode) without variations in the power consumption. Another aspect of the present invention enables isolation cell 150 to avoid floating nodes. Both aspects will be clearer by appreciating the details of a prior isolation cell, and accordingly the description is continued with respect to a prior isolation cell.

3. Example Prior Isolation Cell

Figure 2:
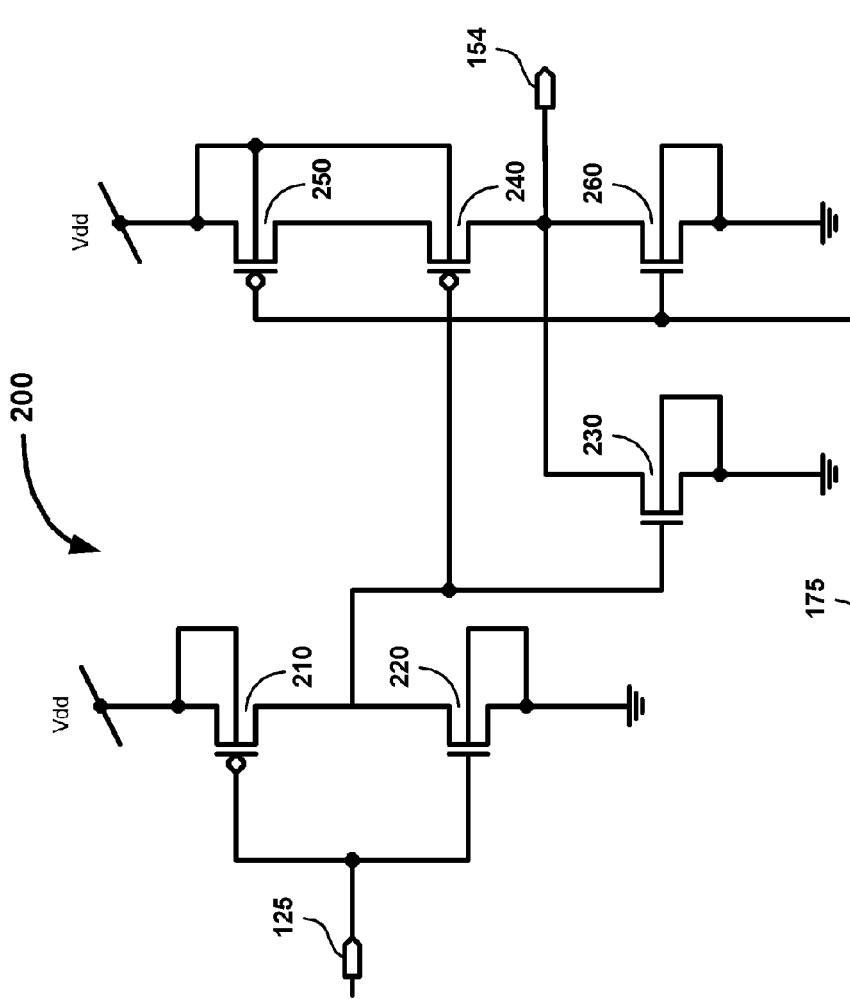
FIG. 2 is a circuit diagram illustrating implementation of an isolation cell in a prior embodiment.

FIG. 2 is a circuit diagram illustrating implementation of isolation cell 200 in a prior embodiment. The prior circuit is described in the context of FIG. 1 merely for illustration. The circuit is shown containing PMOS transistors 210, 240 and 250 and NMOS transistors 220, 230, and 260. Each component is described below in further detail. First, the connections of the components are described, followed by the general operation as an isolation cell. The limitations of the prior circuit are then described.

Transistors 210 and 220 are connected in push-pull configuration ("first push-pull inverter"). Path 125 is connected to the gate terminals of transistors 210 and 220 (input of the first push-pull). The output from the first push-pull inverter is provided to the gate terminals of transistors 230 and 240 which are again connected in push-pull configuration ("second push-pull transistor"). The output from the second push-pull inverter is provided on path 154. The status signal (on path 175) is connected to the gate terminals of transistors 250 and 260.

When power supply (Vdd) is provided to first push-pull inverter (transistors 210 and 220) and second push-pull inverter (transistor 240 and 230), the first push-pull inverter performs first inversion and the second push-pull inverter performs second inversion of the input signal received on path 125 to provide a signal on path 154 having the same logic level as the received signal. Thus, the first push-pull inverter and the second push-pull inverter together operate as an propagating circuit.

Transistor 260 operates as a switch to connect path 154 to ground when status signal is logic high, and operates as open circuit when status signal is at logic low. Transistor 250 connects power supply (Vdd) to second push-pull inverter when status signal 175 is at logic low and causes a disconnect when status signal 175 is at logic high. When disconnected from Vdd, the second push-pull inverter becomes non-operative (i.e., does not operate as an inverter).

When the isolation cell is located and co-powered along with module 120, the isolation cell receives power supply (Vdd) and a logic low status signal when module 120 is in power-up mode. As a result transistors 210, 220, 230 and 240 operate to propagate the signal received on path 125 to path 154. Isolation cell receives only a logic high status signal (Vdd is cutoff to Isolation cell) when module 120 is in power down mode. As a result transistor 260 (operating as a maintaining circuit) maintains path 154 at logic low (as desired in this scenario)

From the above description, it can be appreciated that isolation cell 200 operates to provide a desired logic value (low) when module 120 is in power-down mode, and propagates the value received on path 125 to path 154 when module 120 is in power-up mode. However, as described below, isolation cell 200 may drain unacceptable amount of power when located associated with module 140, but not when located with module 120.

Continuing with the description when isolation cell 200 is located associated with module 120, isolation cell 200 does not drain any power while module 120 is in power-down mode since power supply is removed from the isolation cell. However, path 154 is maintained at logic low in such a configuration, as described above.

On the other hand, when isolation cell 200 is located associated with module 140, signal on gate terminals of the transistors 210 and 220 (still connected to output of module 120 on path 125) remain floating (not tied to either logic low or logic high), thereby representing a floating node. Due to the floating node (gate terminal), transistors 210 and 220 operate as a conductor (short circuit) and draw unacceptable high current (power drain) from the power supply (Vdd) (in the power-down mode of module 120).

Hence, isolation cell 200, when located associated with module 140, may consume unacceptable amount of power while module 120 is in power-down mode. As a result, a designer may need to locate isolations cells associated with portions in power-down mode. As noted above in the background section, such constraints are undesirable in several environments.

The manner in which various aspects of the present invention overcome at least some of the limitations above, is described in further detail below with respect to FIG. 3.

4. Invention

Figure 3:
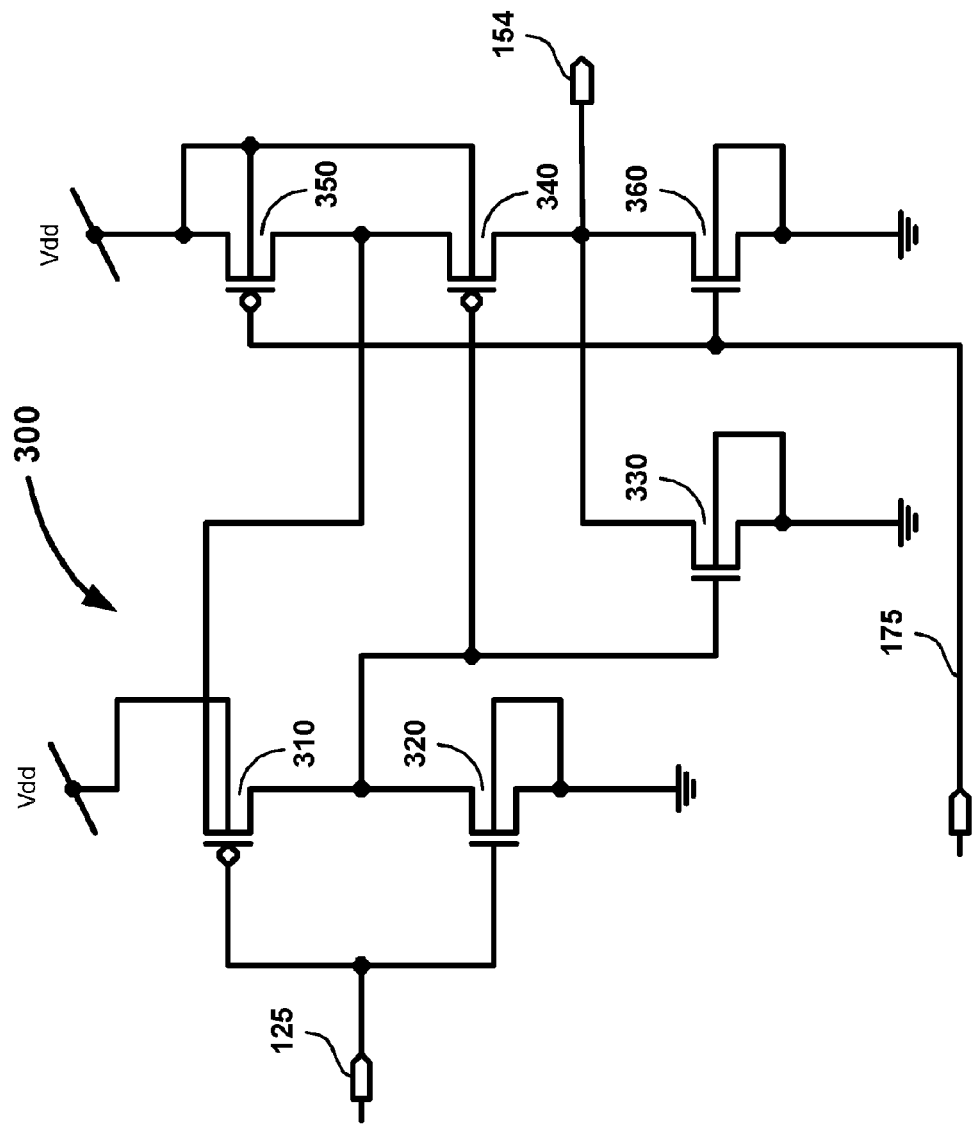
FIG. 3 is an example circuit diagram illustrating an isolation cell implemented according to an aspect of present invention.

FIG. 3 is an example circuit diagram illustrating the details of an isolation cell implemented according to an aspect of the present invention. The circuit is described in the context of FIG. 1 for illustration. The circuit diagram is shown containing transistors 310, 320, 330, 340, 350 and 360. Each transistor is described below in further detail.

The connections of FIG. 3 are similar to that in FIG. 2, except that the source terminal of transistor 310 is connected to the drain terminal of transistor 350 and the bulk terminal is connected to the power supply Vdd. In this context, transistor 350 operates as a switch which connects Vdd to a first push-pull inverter (formed by transistors 310 and 320) when status signal 175 indicates that module 120 is in power-up mode, and disconnects Vdd from the push-pull inverter when status signal 175 indicates that module 120 is in power-down mode.

Due to such a disconnect, the discharge of power by transistors 310/320 is avoided during the power-down mode of module 120 even if isolation cell 150 is implemented associated with module 140 (which is always in power-up mode, in the illustrative example). The operation of the transistors of FIG. 3 is described below in further detail.

Other than the above-noted difference, transistors 310 and 320 are connected in push-pull configuration and operate as a first push-pull inverter (similar to the combination of transistors 210, 220). Similarly, transistors 330 and 340 are also connected in push-pull configuration and operate as a second push-pull inverter. Path 125 is connected to the input of the first push-pull inverter and the output of the first push-pull inverter is connected to the input of second push-pull inverter. Output from the second push-pull inverter is provided on path 154. Power supply (Vdd) is provided to both push-pull inverter through transistor switch 350. Control signal on path 175 is connected to gate terminals of the transistor switches 350 and 360.

Transistors 310, 320, 330, and 340 (first push-pull inverter and second push-pull inverter operating as a section) together operate (similar to operation of transistors 210, 220, 230 and 240 described in FIG. 2) to propagate input signal on path 125 to path 154, when module 120 is in power-up mode. Transistor 360 operate (similar to operation of transistor 260 described in FIG. 2) to maintain input of the module 140 (path 154) at logic low value when module 120 is in power-down mode.

When isolation cell 300 is located within module 120, the isolation cell receives power supply (Vdd) when module 120 is in power-up mode and does not receive power supply (Vdd) when module 120 is in power down mode. When module 120 is in power-up mode, transistor switch 350 connects power supply (Vdd) to the source terminals of transistors 310 and 340. As a result, the first push-pull inverter and the second push-pull inverter become operative and propagate the output signal from module 120 (on path 125) to input of module 140 (on path 154).

When module 120 is in power-down mode, a logic high status signal turns on transistor switch 360 (operating as another section). As a result, path 154 is connected to the ground terminal representing a logic low on path 154. Since the power supply to the isolation cell 300 is removed when module 120 is in power-down mode, the power drain of concern is avoided in isolation cell 150.

Even though the description is provided with respect to status signal 175 indicating power-up mode on a logic low and power down mode on logic high, alternative embodiments can be implemented in which the status signal uses a different convention, i.e., logic high for power-up mode. Various such embodiments will be apparent to one skilled in the relevant arts by reading the disclosure provided herein.

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
   a first module and a second module, said first module is operable in a power-down mode or a power-up mode while said second module is operable in said power-up mode; and
   an isolation cell provided between said first module and said second module, said isolation cell connecting an output of said first module as an input to said second module if said first module is in said power-up mode, and maintaining the input of the said second module at a desired logic value if said first module is in said power-down mode,
   wherein said isolation cell is designed to operate using power provided from either said first module or said second module without a floating node of any of the transistors contained in said isolation cell, wherein a transistor forms said floating node if one terminal of the transistor is powered while another terminal of the transistor is open in said power-down mode of said first module.

2. The integrated circuit of claim 1, wherein a status signal received by said isolation cell indicates whether said first module is in said power-up mode or said power-down mode, wherein said isolation cell comprises:
   a first section and a second section,
   said second section operating to maintain the input of said second module at a desired logic value when said status signal indicates that said first module is in power-down mode,
   said first section propagating a value representing the output of said first module to input of said second module when said first module is in said power-up mode, power supply being cut to said first section when said first module is in said power-down mode, whereby leakage of current is avoided in said power-down mode of said first module.

3. The integrated circuit of claim 2, wherein said second section comprises a switch connecting said first section to said power supply in said power-up mode and disconnecting said first section from said power supply in said power-down mode.

4. The integrated circuit of claim 3, wherein said first section comprises a pair of push-pull inverters connected in series, said pair of push-pull inverters operating to propagate said value to input of said second module.

5. An isolation cell provided between an output of a first module and an input of a second module, said first module being operable in a power-down mode or a power-up mode while said second module is operable in said power-up mode, said isolation cell comprising:
   a first inverter and a second inverter connected in series and operating to propagate a value from said output of said first module to said input of said second module; and
   a switch connecting a power supply to each of said first inverter and said second inverter when said first module is in said power-up mode and disconnects said power supply from each of said first inverter and said second inverter when said first module is in said power-down mode.

6. An isolation cell provided between an output of a first module and an input of a second module, said first module being operable in a power-down mode or a power-up mode while said second module is operable in said power-up mode, said isolation cell comprising:

a first inverter and a second inverter connected in series and operating to propagate a value from said output of said first module to said input of said second module; and a switch connecting a power supply to each of said first inverter and said second inverter when said first module is in said power-up mode and disconnects said power supply from each of said first inverter and said second inverter when said first module is in said power-down mode, wherein said switch comprises a first transistor connected between said power supply and a point from which power is provided to said first inverter and said second inverter, a second transistor connected between said input of said second module and ground, wherein a gate terminal of said second transistor is connected to receive a status signal indicating whether said first module is in said power-up mode or said power-down mode, and wherein the gate terminal of said first transistor is also connected to said status signal.

7. The isolation cell of claim 6, wherein each of said first inverter and said second inverter comprises a push-pull inverter.

8. An isolation cell provided between an output of a first module and an input of a second module, said first module being operable in a power-down mode or a power-up mode while said second module is operable in said power-up mode, said isolation cell comprising:

a first push-pull inverter containing a first transistor and a second transistor, the gate terminal of each of said first transistor connected to said output of said first module;

a second push-pull inverter containing a third transistor and a fourth transistor, the gate terminal of each of said third transistor and said fourth transistor being connected to the output of said first push-pull inverter, the output of said second push-pull inverter connected to said input of said second module;

a fifth transistor having a source terminal connected to a power supply and a drain terminal connected to provide power to said first push-pull inverter and said second push-pull inverter;

a sixth transistor having a drain terminal connected to said input of said second module and a source terminal connected to ground, a gate terminal of each of said fifth transistor and sixth transistor connected to a status signal indicating whether said first module is in said power-down mode or said power-up mode, one of said fifth transistor and said sixth transistor comprising a PMOS transistor and the other one of said fifth transistor and said sixth transistor comprising a NMOS transistor.

* * * * *